(12) United States Patent
Stadnik et al.

(10) Patent No.: US 11,878,473 B2
(45) Date of Patent: Jan. 23, 2024

(54) ADDITIVE PRINTING METHOD FOR PRINTING A FUNCTIONAL PRINT PATTERN ON A SURFACE OF A THREE-DIMENSIONAL OBJECT, ASSOCIATED COMPUTER PROGRAM AND COMPUTER-READABLE MEDIUM

(71) Applicant: Heraeus Deutschland GmbH & Co. KG, Hanau (DE)

(72) Inventors: Alan Paul Stadnik, Hanau (DE); Thorsten Opiolka-Schäfer, Hanau (DE); Andreas Steigerwald, Hanau (DE); Urs Neudecker, Hanau (DE); Christoph Sternkiker, Hanau (DE)

(73) Assignee: HERAEUS DEUTSCHLAND GMBH & CO. KG, Hanau (DE)

( * ) Notice: Subject to any disclaimer, the term of this patent is extended or adjusted under 35 U.S.C. 154(b) by 7 days.

(21) Appl. No.: 17/347,927

(22) Filed: Jun. 15, 2021

(65) Prior Publication Data
US 2021/0394455 A1  Dec. 23, 2021

(30) Foreign Application Priority Data
Jun. 18, 2020 (EP) .................................... 20180763

(51) Int. Cl.
*B29C 64/393* (2017.01)
*B33Y 10/00* (2015.01)
(Continued)

(52) U.S. Cl.
CPC .......... *B29C 64/393* (2017.08); *B29C 64/112* (2017.08); *B29C 64/209* (2017.08);
(Continued)

(58) Field of Classification Search
CPC .................................................. B29C 64/393
See application file for complete search history.

(56) References Cited

U.S. PATENT DOCUMENTS

2005/0195229 A1  9/2005 Barss
2012/0219699 A1  8/2012 Pettersson et al.
(Continued)

FOREIGN PATENT DOCUMENTS

CN  103419491  12/2013
CN  104023989  9/2014
(Continued)

OTHER PUBLICATIONS

International Search Report and Written Opinion dated Nov. 23, 2020 for corresponding European Patent Application No. 20180763.3.

(Continued)

*Primary Examiner* — Suresh Suryawanshi
(74) *Attorney, Agent, or Firm* — Panitch Schwarze Belisario & Nadel LLP (57) ABSTRACT

An additive printing method depositing a functional print pattern on a surface of a 3D object, an associated computer program, and a computer-readable medium storing the program. The method comprises as steps (i) providing the object on a planar surface; (ii) providing a print head having print nozzles defining a plane non-parallel to the planar surface; (iii) generating 3D geometrical surface data of an exposed surface of the object on the planar surface; (iv) generating 2D geometrical surface data of the exposed surface on the basis of the 3D geometrical surface data; (v) determining an amount of printing fluid to be discharged at a discharge time from each of the print nozzles; (vi) generating a relative movement between the object and the print head; and (vii) printing a print pattern on at least one portion of the exposed surface during the relative movement. A step of correcting data is included.

19 Claims, 4 Drawing Sheets

(51) Int. Cl.
*B33Y 50/02* (2015.01)
*B29C 64/112* (2017.01)
*B29C 64/209* (2017.01)

(52) U.S. Cl.
CPC .............. *B33Y 10/00* (2014.12); *B33Y 50/02* (2014.12); *G05B 2219/49007* (2013.01)

(56) References Cited

U.S. PATENT DOCUMENTS

| | | | |
|---|---|---|---|
| 2013/0076817 | A1 | 3/2013 | Olson et al. |
| 2013/0307892 | A1 | 11/2013 | Byun et al. |
| 2013/0342592 | A1 | 12/2013 | Merz |
| 2014/0313254 | A1 | 10/2014 | Sohgawa |
| 2015/0029262 | A1 | 1/2015 | Weingartner |
| 2017/0320346 | A1* | 11/2017 | Zhou .................. B41M 5/0088 |
| 2017/0355145 | A1* | 12/2017 | Valade ................ B29C 64/386 |
| 2018/0097956 | A1 | 4/2018 | Ionascu |
| 2018/0272596 | A1* | 9/2018 | Giller .................... B29C 64/40 |
| 2019/0016121 | A1 | 1/2019 | Baker et al. |
| 2019/0091937 | A1* | 3/2019 | Ramirez Muela ..... B33Y 50/02 |
| 2020/0073365 | A1* | 3/2020 | Lee ................... G05B 19/4099 |
| 2020/0108598 | A1 | 4/2020 | Flannigan et al. |
| 2021/0283828 | A1 | 9/2021 | Dikovsky et al. |

FOREIGN PATENT DOCUMENTS

| | | |
|---|---|---|
| CN | 109572228 | 4/2019 |
| CN | 110582746 | 12/2019 |
| CN | 110920070 | 3/2020 |
| JP | 2001010032 | 1/2001 |
| JP | 2001260329 A | 9/2001 |
| JP | 2008263094 A | 10/2008 |
| JP | 2014225228 A | 12/2014 |
| JP | 2018513029 A | 5/2018 |
| JP | 2019119156 A | 7/2019 |
| JP | 2020047939 A | 3/2020 |
| JP | 2002067171 | 3/2022 |
| KR | 20030069916 A * | 8/2003 |
| KR | 20160138156 | 12/2016 |
| TW | 200946247 | 11/2009 |
| WO | 2009123624 | 10/2009 |
| WO | 2019002153 | 1/2019 |

OTHER PUBLICATIONS

Notice of Reasons for Rejection dated Jul. 26, 2022 in JP Application No. 2021-100732 (with English Translation).
Taiwanese Office Action from corresponding Taiwan Patent Application No. 110122052 dated Apr. 8, 2022.
Korean Office Action from corresponding Korean Patent Application No. 10-2021-0075364 dated Apr. 28, 2022.

* cited by examiner

ADDITIVE PRINTING METHOD FOR PRINTING A FUNCTIONAL PRINT PATTERN ON A SURFACE OF A THREE-DIMENSIONAL OBJECT, ASSOCIATED COMPUTER PROGRAM AND COMPUTER-READABLE MEDIUM

This application claims the benefit of priority to European Patent Application No. 20180763.3 filed on Jun. 18, 2020, the contents of which are incorporated in this application by reference.

TECHNICAL FIELD

The present invention relates to an additive printing method for (digital) printing a functional print pattern on a surface of a three-dimensional (3D) object. The present invention also relates to an associated computer program and to a computer-readable medium having the computer program stored on the medium.

BACKGROUND OF THE DISCLOSURE

There exist a wide variety of different printing methods including, among others, offset lithography, flexography, screen printing, gravure and digital printing. Digital printing, such as inkjet printing and xerography, prints from a digital-based image directly to various types of media. Other printing methods may be available for specific applications.

Inkjet printing methods have been widely used for printing on paper and, therefore, focus on two-dimensional (2D) surfaces. However, inkjet printing methods may also be used for other purposes. For example, they may be employed for depositing a functional layer or a functional print pattern on three-dimensional objects, such as for example applying conductive ink on a "System in Package" (SIP) to protect the SIP from electromagnetic interference.

SIP modules play an increasingly important role in the miniaturization of portable electronic devices. Due to the high density of the electrical functions built into an SIP module, electromagnetic or electrical interference (EMI) may cause complete failure of the module. To this end, SIP modules have to be shielded to inhibit EMI radiation both to emanate from and to be received by the SIP module.

Traditionally, SIP modules use a metal housing for the purpose of EMI shielding. A metal housing, however, counteracts the objective of miniaturization. Instead of using a metal housing, a functional layer can be applied, for example by a physical vapor deposition (PVD) process. Alternatively, for example, a silver-containing inkjet ink can be deposited on the surface of a SIP module using an inkjet printer. Once the inkjet ink is printed on the surface of the SIP module, the inkjet ink is cured using, for example, ultraviolet (UV) light in order to form a continuous functional layer on the surface of the SIP module. Other mechanisms for curing are conceivable, such as infrared (IR)-radiation or plasma. Prior to the printing process, the surface of the SIP module may undergo a pretreatment process for cleaning purposes. Again, plasma may be used to this end.

U.S. Patent Application Publication No. 2013/0342592 A1 discloses an inkjet printer which is used for printing an EMI shield on a three-dimensional electronic device. The electronic device is mounted on a fixture that can be tilted and rotated so that the EMI shield can be deposited on non-parallel surfaces of the electronic device.

Additive inkjet printing methods for printing a functional print pattern (layer) on a three-dimensional object, such as an electronic device, significantly differ from inkjet printing methods which are used for graphical purposes. Although the most important factor in graphical printing methods is the areal density ($g/m^2$) of the inkjet ink deposited on a particular substrate, such as paper, the layer thickness, among other things, is of paramount importance when printing a functional print pattern on an electronic device, such as a SIP module. The final layer thickness, the material density ($g/m^3$) and the structural uniformity and homogeneity in the thickness directions as well across the surface of the functional print pattern have a decisive impact on the function of the electronic device. Efficiency and economical aspects need to be considered as well.

International Patent Application Publication No. WO 2019/002153 A1 discloses a digital inkjet printing method for printing on a curved surface of a three-dimensional object. The method uses a print head with a multiplicity of print nozzles arranged in a print nozzle plane. The print nozzle plane is positioned vertically above the curved surface. Only those print nozzles are activated during printing whose distance to the curved surface is within a predetermined range. (By "predetermined" is meant determined beforehand, so that the predetermined characteristic must be determined, i.e., chosen or at least known, in advance of some event.)

U.S. Patent Application Publication No. 2012/0219699 A1 discloses a graphical application system having a surface-spattering device with at least one nozzle that expels a spattering material onto a target surface, such as sheet metals, car or airplane bodies, boat hulls, etc. A nozzle control mechanism controls the amount of spattering material which is expelled by the nozzle. A spatial referencing unit is used to determine the position and orientation of the nozzle relative to the target surface at any time. To this end, two 2D cameras on a stereobasis are used, and from the 2D image data together with a specified reference point, 3D data are generated by digital image processing. These 3D data are then used to automatically adjust the expelling characteristics of the nozzle.

U.S. Patent Application Publications No. 2020/073365 A1, No. 2020/108598 A1, No. 2019/016121 A1 and No. 2005/195229 A1 and JP 2001 010032 A illustrate references that represent mere technological background.

SUMMARY OF THE DISCLOSURE

It is an object of the present invention to provide an additive printing method for printing a functional print pattern on a surface of a three-dimensional object which mitigates or overcomes drawbacks of prior art printing methods. In particular, it is an object of the present invention to provide an additive (digital) printing method which prints a functional print pattern on a surface of a three-dimensional object with uniform and homogenous thickness, and preferably high throughput. It is also an object of the present invention to provide a computer program which controls an inkjet printer for carrying out the additive printing method, and a computer-readable medium having the computer program stored on the medium.

These objects are achieved by the subject matter disclosed below.

A first aspect of the invention relates to an additive printing method for printing a functional print pattern on a surface of a three-dimensional object. The method according to the invention comprises the steps of (i) providing a three-dimensional object on a planar surface; (ii) providing a print head having a plurality of print nozzles, the plurality of print nozzles defining at least one print nozzle plane, the print nozzle plane being non-parallel to the planar surface; (iii) generating three-dimensional geometrical surface data of an exposed surface of the object on the planar surface; (iv) generating two-dimensional geometrical surface data of the exposed surface of the object on the planar surface on the basis of the three-dimensional geometrical surface data; (v) determining an amount of printing fluid to be discharged at a discharge time from each of the plurality of print nozzles; (vi) generating a relative movement between the object and the print head; and (vii) printing a print pattern on at least one portion of the exposed surface of the object during the relative movement. According to the invention, the step of generating the two-dimensional geometrical surface data includes the step of projecting the two-dimensional geometrical surface data onto the print nozzle plane to correct distortions present in the two-dimensional geometrical surface data due to the print nozzle plane being non-parallel with the planar surface, thereby obtaining two-dimensional print nozzle plane data of the object.

Preferably, the three-dimensional geometrical surface data and the two-dimensional geometrical surface data are generated relative to the planar surface.

More preferably, the method further comprises the step of determining positional data of the three-dimensional object on the planar surface.

It is preferable that the positional data of the three-dimensional object on the planar surface are determined using an optical imaging or optical scanning device.

It is also preferable that the step of projecting the two-dimensional geometrical surface data onto the print nozzle plane takes into account the positional data of the three-dimensional object on the planar surface.

According to another preferred embodiment of the invention, the three-dimensional geometrical surface data are generated using 3D-computer assisted design (CAD) data or 3D data obtained by an imaging scanning device.

Preferably, the amount of printing fluid to be discharged from each of the plurality of print nozzles is determined based on (i) the two-dimensional print nozzle plane data, and/or (ii) a layer thickness of the functional print pattern, and/or (iii) a characteristic of the relative movement, and/or (iv) a transfer time of the printing fluid, the transfer time being defined by the time period which elapses between the discharge time of the printing fluid from the respective print nozzle and an impact time on the exposed surface of the object, and/or (v) the print pattern to be printed on the exposed surface of the object, and/or (vi) a user requirement.

The characteristic of the relative movement is preferably a relative velocity between the object and the print head.

Yet further preferably, the discharge time of the printing fluid varies among the plurality of print nozzles.

It is advantageous that the object is moved relative to the print head during relative movement between the object and the print head.

According to another preferred embodiment of the invention, after the print pattern has been printed on at least one portion of the exposed surface of the object, the print head or the object is displaced around a horizontal axis and/or a vertical axis in order to print another print pattern on the exposed surface of the object.

It is also preferred that, after the print pattern has been printed on at least one portion of the exposed surface of the object, the print pattern is cured.

According to another preferred feature of the invention, an angle between the print nozzle plane and the planar surface is in a range between 20° to 70°, preferably in a range between 40° to 50°, most preferably is about 45°. (The term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art.)

More preferably, the method according to the invention further comprises the steps of providing a second print head having a plurality of second print nozzles, the plurality of second print nozzles defining at least one second print nozzle plane, the second print nozzle plane being non-parallel to the planar surface, arranging the second print head collinearly with the print head, and generating a relative movement between the object and the second print head.

Yet more preferably, the relative movement between the object and the print head and the relative movement between the object and the second print head are generated along a straight printing path on which the collinear print head and second print head are arranged.

It is advantageous that the method is an inkjet printing method.

Preferably, a layer thickness of the functional print pattern is in a range of 0.0001 µm to 100 µm, preferably 0.001 µm to 50 µm, more preferably 0.1 µm to 5 µm, yet more preferably 0.2 µm to 1 µm.

A second aspect of the invention relates to a computer program comprising instructions to cause an inkjet printer to carry out the steps of (i) generating three-dimensional geometrical surface data of an exposed surface of a three-dimensional object on a planar surface; (ii) generating two-dimensional geometrical surface data of the exposed surface of the object on the planar surface on the basis of the three-dimensional geometrical surface data; and (iii) determining an amount of printing fluid to be discharged at a discharge time from a print head having a plurality of print nozzles, the plurality of print nozzles defining at least one print nozzle plane, the print nozzle plane being non-parallel to the planar surface. According to the invention, the step of generating the two-dimensional geometrical surface data includes the step of projecting the two-dimensional geometrical surface data onto the print nozzle plane to correct distortions present in the two-dimensional geometrical surface data due to the print nozzle plane being non-parallel with the planar surface, thereby obtaining two-dimensional print nozzle plane data of the object.

A third aspect of the invention relates to a computer-readable medium having the foregoing computer program stored on the medium.

It is to be understood that both the foregoing general description and the following detailed description are exemplary, but are not restrictive, of the disclosure.

BRIEF DESCRIPTION OF THE DRAWING

The present invention will now be described by way of example using the attached figures. The figures are for illustrative purposes and serve only to provide an exemplary embodiment of the invention. The figures in no way limit the present invention, but merely represent preferred embodiments of the invention. Included in the drawing are the following figures.

DETAILED DESCRIPTION OF THE DISCLOSURE

The present invention is generally suitable for high-volume printing of a functional print pattern on three-dimensional objects (devices), such as for example electronic devices. It is particularly suitable to deposit a functional layer on a so-called "System in Package" (SIP). The functional layer may be any sort of layer which, when being applied, achieves a particular function. This function is preferably an electric and/or electronic function. However, it may also be a protective and/or an insulating function.

This function may be the shielding of the electronic device from electromagnetic interference (EMI) caused by electromagnetic induction or electromagnetic radiation emitted from an external source. The functional layer may be composed of a conductive ink which is a type of ink that, when being printed and preferably cured, produces electrically conductive properties. Examples of such types of ink are a silver ink or a silver-containing ink. The conductive ink may also be of a type which includes conductive particles, for example silver particles.

In order for the conductive ink to act as an EMI shield, printing must be performed such that the conductive ink forms a continuous layer on the exposed surfaces of the electronic device with no gaps larger than a quarter wavelength of the frequency of the external electromagnetic radiation which is to be blocked. The functional layer may also be a non-conductive layer, such as a protection layer, which protects the conductive layer underneath the protection layer from damage and/or other adverse environmental influences, such as excessive heat and corrosion-inducing substances, for example oxygen.

Using the method according to the present invention, the functional layer may be deposited only on certain portions or on the entire exposed surface of the three-dimensional object (device), and the layer thickness can selectively be manipulated such that it varies or is highly uniform and homogenous throughout the printed portions of the exposed surface of the three-dimensional object. The final layer thickness, of course depending on the absolute thickness value, may be achieved in one or several subsequent printing steps. Thus, highly effective functional layers can be achieved with properties that may specifically be adapted to user needs and requirements.

A layer thickness of the functional print pattern is preferably in a range of 0.0001 µm to 100 µm, preferably 0.001 µm to 50 µm, more preferably 0.1 µm to 5 µm, yet more preferably 0.2 µm to 1 µm.

The three-dimensional objects that are used in the method of the present invention may preferably be electronic devices which may have any three-dimensional geometry with surfaces extending in different directions. The present invention can in principle be employed in any digital printing process, preferably digital inkjet printing processes, by which conductive and non-conductive coatings (layers, print patterns) can be deposited with a selectively adjustable thickness, high structural uniformity and homogeneity and high throughput.

Figure 3:
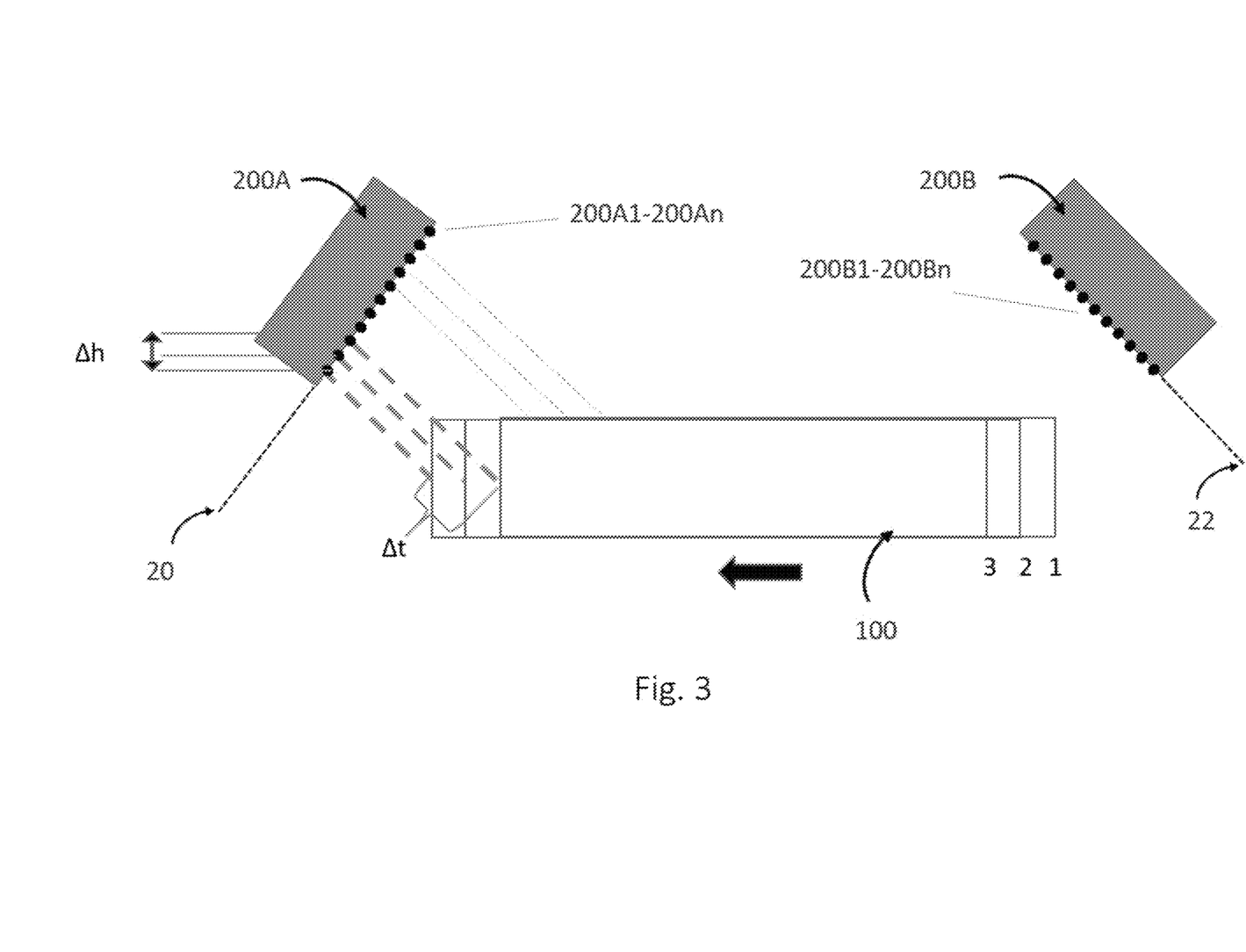
FIG. 3 shows a simplified set-up of a printer suitable for carrying out a printing method according to a preferred embodiment of the invention.

Inkjet printers are generally known and may have different set-ups specifically adapted to user requirements. The method of the present invention is carried out using preferably an inkjet printer with one or more print heads. Each print head has a multiplicity of print nozzles which are arranged in a print nozzle plane 20 (FIG. 3). The printing width of a print head used in the method of the present invention may be selected depending on the size of the three-dimensional object, for example about 30.5 cm (12 inches) and larger. The print head may preferably comprise a multiplicity of print head units, for example six, with each print head unit having a width of about 5.1 cm (2 inches), for example. The printing speed may be up to about 2,000 mm/second, whereas the print head frequency, which is the frequency at which ink droplets are ejected by the print head, may be up to about 150 kHz.

Figure 1:
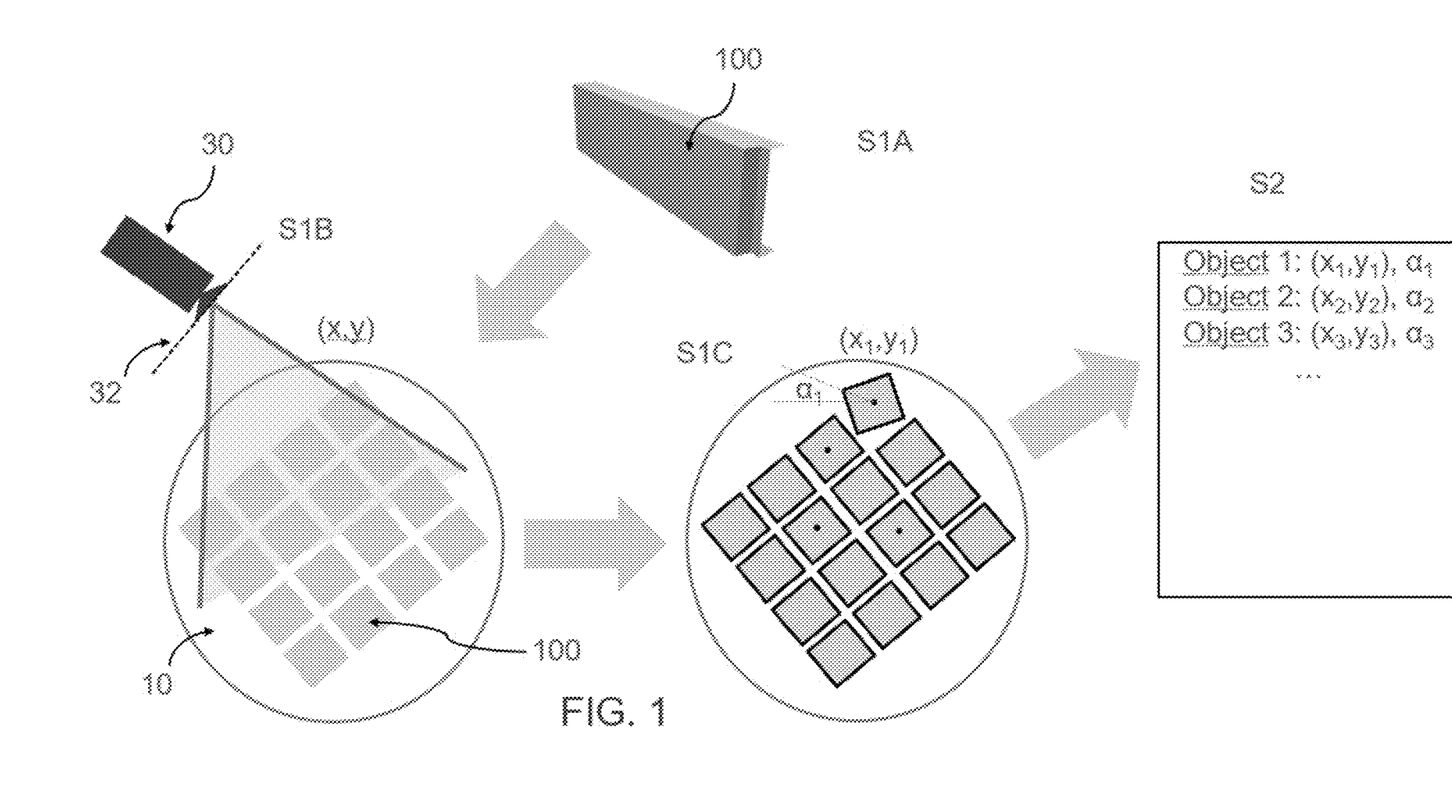
FIG. 1 shows a first sequence of steps forming a method according to a preferred embodiment of the invention.

FIG. 1 shows a first sequence of steps employed in a method according to a preferred embodiment of the present invention. A three-dimensional object, for example an electronic device, such as a SIP, is denoted by reference numeral 100. In step S1A, the three-dimensional object 100 is provided. In fact, a multiplicity of three-dimensional objects 100 may be arranged on a planar surface 10 which, for the sake of simplicity, extends in the x- and y-directions. The planar surface 10 may be a surface of a substrate holder of the inkjet printer, or may be any other surface suitable for positioning one or a multiplicity of three-dimensional objects 100 on the surface which undergo a printing process inside the inkjet printer. In case of a multiplicity of three-dimensional objects 100, they are preferably arranged in a grid-like fashion and more preferably equidistantly to each other on the planar surface 10.

The provision of the three-dimensional object 100 in step S1A preferably includes the step of defining the three-dimensional geometry of the object 100. To this end, geometrical surface data are defined or determined. They may be provided by an external source, such as an external database (customer), preferably in the form of 3D CAD data, or they may be obtained by using an on-site laser scanning device (not shown), which laser-scans the topography of the exposed surfaces (in the following referred to as the exposed surface) of the three-dimensional object 100 on the planar surface 10. These geometrical surface data may preferably be converted into three-dimensional vector graphics data (polygon data) which form the basis of a digital three-dimensional object file.

In step S1B shown in FIG. 1, the exact position of each of the multiplicity of three-dimensional objects 100 on the planar surface 10 is determined, preferably using an optical imaging system, such as a camera 30, or an optical scanning device, such as a laser line scanner, thus obtaining positional data of the one or more three-dimensional objects 100 on the planar surface 10. The orientation and position of the camera 30 is preferably selected such that the field of view of the camera 30 detects all three-dimensional objects 100 on the planar surface 10 at a predetermined angle. The predetermined angle is the angle between a line 32 and the planar surface 10. The line 32 is preferably perpendicular to the major optical axis of the camera 30.

Alternatively, in a first step, the camera 30 takes an image of only a portion of the three-dimensional objects 100, and in a second step or further steps, detects the remainder of the three-dimensional objects 100 on the planar surface 10 at a predetermined angle. The thus-obtained preliminary images are put together to obtain a full image of all three-dimensional objects 100. This is particularly advantageous in view of the resolution of the full image which is higher compared to an image obtained if the camera 30 were to image all three-dimensional objects 100 at once. The same advantage, and associated therewith higher accuracy, is achieved when using an optical scanning device instead of the camera 30.

The camera 30, or the optical scanning device, may not be disposed at an angle relative to the planar surface 10. It may instead be arranged vertically above the planar surface 10. In this case, the three-dimensional objects 100 may either be imaged or scanned at once, or only portions thereof are imaged or scanned in a timely sequence, and then the individual images are framed to obtain a full image of all three-dimensional objects 100. Preferably, the three-dimensional objects 100 are moved while the camera 30, or the optical scanning device, remains stationary.

In step S1C, a possible misalignment (misorientation) of a three-dimensional object 100 on the planar surface 10 may be detected and taken into account when determining the positional data of each object 100 on the planar surface 10. A misalignment will preferably be expressed in terms of an angle $\alpha$ in the xy-plane. The angle $\alpha$ is preferably zero for all objects 100 showing no misalignment. The angle $\alpha$ is measured in the xy-plane relative to a particular reference point located on the three-dimensional object 100, such as the center of gravity thereof. Alternatively, the orientation of all correctly oriented objects 100 may be expressed by an angle $\alpha_y$, and any misoriented object 100 may be denoted by an angle $\alpha_n$.

In a modification of step S1C, a misalignment in the z-direction, i.e., in a direction perpendicular to the planar surface 10 (xy-plane), may in addition be taken into account and may be expressed by an angle $\beta$.

The references to the x, y, and z directions and planes are in the context of a Cartesian coordinate system. This (x, y, z) coordinate system specifies each point uniquely in three-dimensional space by three Cartesian numerical coordinates, which are the signed distances to the point from three, fixed, mutually perpendicular directed lines, measured in the same unit of length. Each reference line is called a coordinate axis or just an axis of the system, and the point where they meet is its origin, usually at ordered triplet (0, 0, 0). The coordinates can also be defined as the positions of the perpendicular projections of the point onto the three axes, expressed as signed distances from the origin.

In step S2, which includes a second sequence of steps explained with reference to FIG. 2, a digital print file is created including a modification of the geometrical surface data obtained in step S1A, preferably of the positional data obtained in step S1B and the misalignment data obtained in step S1C of all objects 100 on the planar surface 10. How these data are modified will now be explained with reference to FIG. 2.

Starting from the three-dimensional geometrical surface data of the exposed surface of the three-dimensional object 100 in step S1A, these three-dimensional geometrical surface data are converted into two-dimensional geometrical surface data, preferably by unfolding (unwrapping). Various software tools may be used for the 3D-to-2D conversion by unfolding, such as for example AutoDesk® Design Suite. To enhance the understanding of the unfolding step carried out in step S2A, one may utilize the following, admittedly simplified example.

Figure 2:
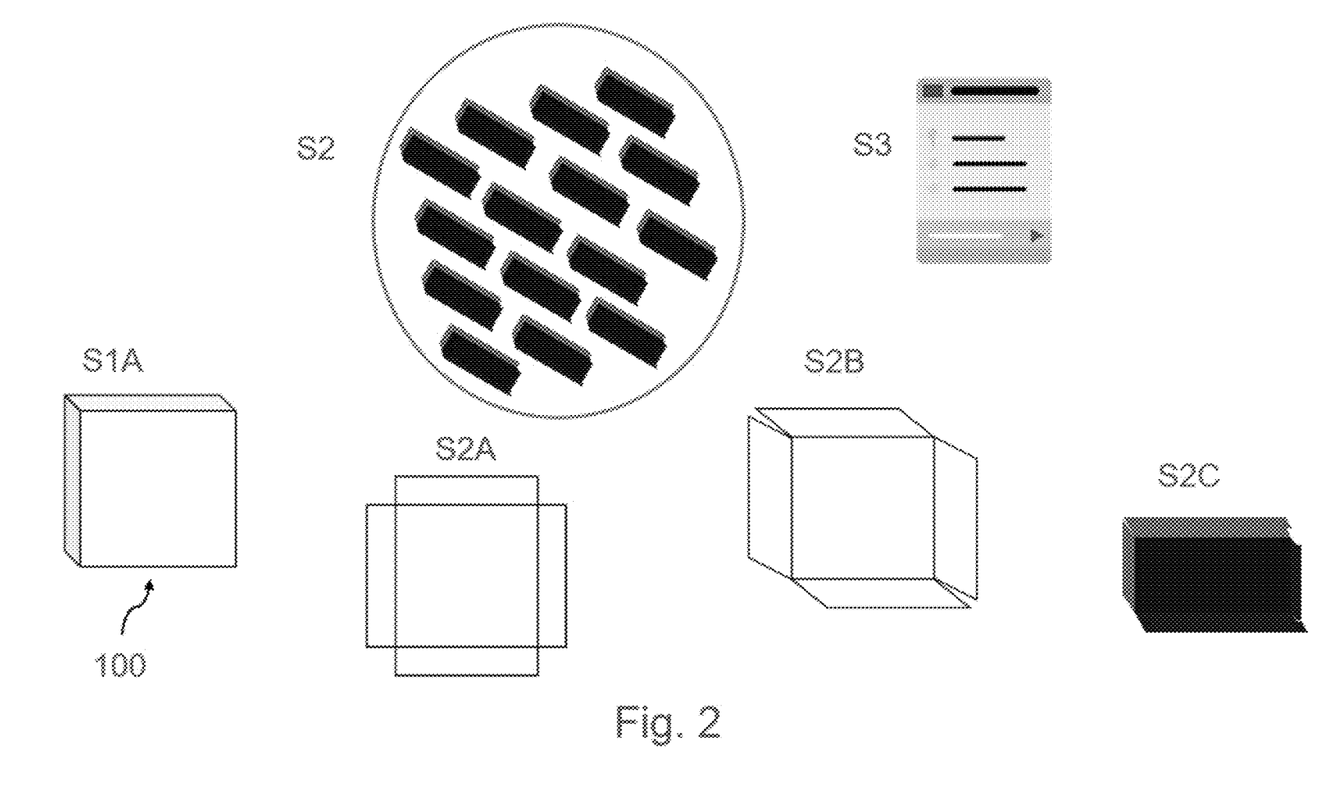
FIG. 2 shows a second sequence of steps forming a method according to another preferred embodiment of the invention.

Assuming the three-dimensional object 100 has the shape of a cuboid, as shown in FIG. 2 and denoted by S1A, and the cuboid is positioned with its bottom rectangle on a planar surface, one then cuts open the cuboid along certain edges to unfold the 3D cuboid and place the unfolded cuboid onto the planar surface. (A cuboid is more or less cubic in shape and a cube is a solid which has six rectangular faces at right angles to each other.) The 2D unfolded cuboid will then have the shape of a symmetrical cross with five rectangles, one central rectangle, which represents the top rectangle of the 3D cuboid, and four rectangles adjacent the four sides of the central rectangle. Note that the bottom rectangle of the 3D cuboid is not shown in S2A in FIG. 2 due to the nature of the unfolding process, and due to the fact that no functional print pattern is printed on the bottom rectangle.

In order to generate two-dimensional geometrical surface data of the exposed surface of the three-dimensional object on the planar surface 10, the exposed surface of a three-dimensional object may be defined by a surface mesh. The surface mesh is placed such that it extends through certain points on the surface of the three-dimensional object. These points preferably define, to a certain extent, the 3D shape of the object. In the case of the cuboid discussed above, those shape-defining points would, for example, be the edges of the cuboid or the eight corner points of the cuboid.

As will be explained later with reference to FIG. 3 and FIG. 4, the print head 200A (and 200B), specifically the print nozzles 200A1-200An (and 200B1-200Bn), of the inkjet printer, which is preferably used to carry out the method of the present invention, is oriented at a predetermined angle with respect to the planar surface 10. This predetermined angle is preferably in a range between about 20 to 70°, preferably in a range between about 40 to 50°, and most preferably is about 45° relative to the planar surface 10.

Due to the print nozzle plane 20 being non-parallel to the planar surface 10, the unfolded two-dimensional geometrical surface data obtained in step S2A inherently include distortions due to the fact that the planar surface 10 is non-parallel to the print nozzle plane 20. Because distances of a 3D cuboid shown in a perspective view on a two-dimensional plane appear shorter the further they are away in the real world, the (unfolded) two-dimensional geometrical surface data do not necessarily reflect real-world distances. Such distortions are corrected in step S2B by projecting the two-dimensional geometrical surface data obtained in step S2A into the print nozzle plane 20 (plane projection), thus obtaining two-dimensional print nozzle plane data of the object 100. For this purpose, the print nozzle plane 20 may be generated virtually, for example using software. The correction is performed using matrix algebra and includes re-scaling by compression (with a correction factor of approximately 0.6) and subsequent shearing of the two-dimensional geometrical surface data. The matrix algebra useful for the plane projection is generally known and therefore not detailed here.

As mentioned above, if the camera 30, or the optical scanning device, is disposed vertically above the planar surface 10, the positional data of the one or more three-dimensional objects 100 on the planar surface 10 obtained in step S1B, and any misalignment data obtained in step S1C, may be processed or converted to take into account the fact that the line 32 does not correspond to the print nozzle plane 20.

Two-dimensional print nozzle plane data of the object 100 are determined (preferably by theoretical deduction rather than from observation or experience) at certain time intervals during movement of the object 100 relative to the print head 200A, thus obtaining a set of two-dimensional print nozzle plane data at various time intervals. This is due to the fact that the amount and possibly type of distortions change during movement of the object 100 towards the print head 200A in the course of the printing process.

In addition, a possibly existing misalignment of an object 100 expressed by the angle α determined in step S1C and shown in FIG. 1 may be taken into account in the set of two-dimensional print nozzle plane data of the object 100 in step S2B.

Preferably, the three-dimensional geometrical surface data and the two-dimensional geometrical surface data are generated relative to the planar surface 10. However, any other plane may be used as well.

In step S2C in FIG. 2, user/customer specifications are considered. Such user specifications may pertain to the required layer thickness of the functional print pattern, the type of functional print pattern (conductive, non-conductive), the material of the functional print pattern, the areas of the exposed surface of the object to be printed, etc.

Steps S1A to S2C are carried out for each three-dimensional object 100 located on the planar surface 10. This way, a print file is obtained in step S2 which is used to control the one or more print heads 200A and 200B of the inkjet printer.

FIG. 3 shows a simplified set-up of a printer useful for carrying out the method of the present invention. This set-up preferably includes two print heads 200A, 200B. Each print head 200A, 200B has a multiplicity of print nozzles 200A1-200An, 200B1-200Bn, respectively, which are located in a print nozzle plane 20, 22. The print nozzle plane 20, 22 is non-parallel to the planar surface 10, on which the three-dimensional object 100 is located.

Assuming that the three-dimensional object 100 is a cuboid, the object 100 is moved relative to the print head 200A with one of its vertical edges in front. Thus, the top surface and two side surfaces of the cuboid are printed using the print head 200A, and when reversing movement of the object 100, the other two side surfaces and the top surface are printed using the print head 200B. The object 100 is preferably moved co-linearly along a straight printing path, with the two print heads 200A, 200B being preferably co-linearly arranged. The object 100, however, may also be reciprocated between the two print heads 200A, 200B.

Numerals 1, 2 and 3 denote a timely sequence of the different longitudinal positions of the object 100 along the printing path. It goes without saying that, in order to achieve a uniform layer thickness on the exposed surface of the object 100, any height difference Δh between the print nozzles 200A1-200An and hence a difference in transfer times Δt of the ink has to be considered. The transfer time is defined as the time period which starts when ink is ejected from the print nozzles 200A1-200An and ends at the time when the ink impacts on the exposed surface of the object 100. In addition, due to movement of the object 100 towards the print head 200A, for example, ink discharged from the lowest one of the print nozzles 200A1-200An will be deposited on an area of the object 100 which at a time period Δt later will again be printed by ink discharged from a different nozzle 200A1-200An. The Δt in FIG. 3 denotes a difference in impact times of the ink discharged from different print nozzles 200A1-200An on a top surface of the object 100.

Figure 4:
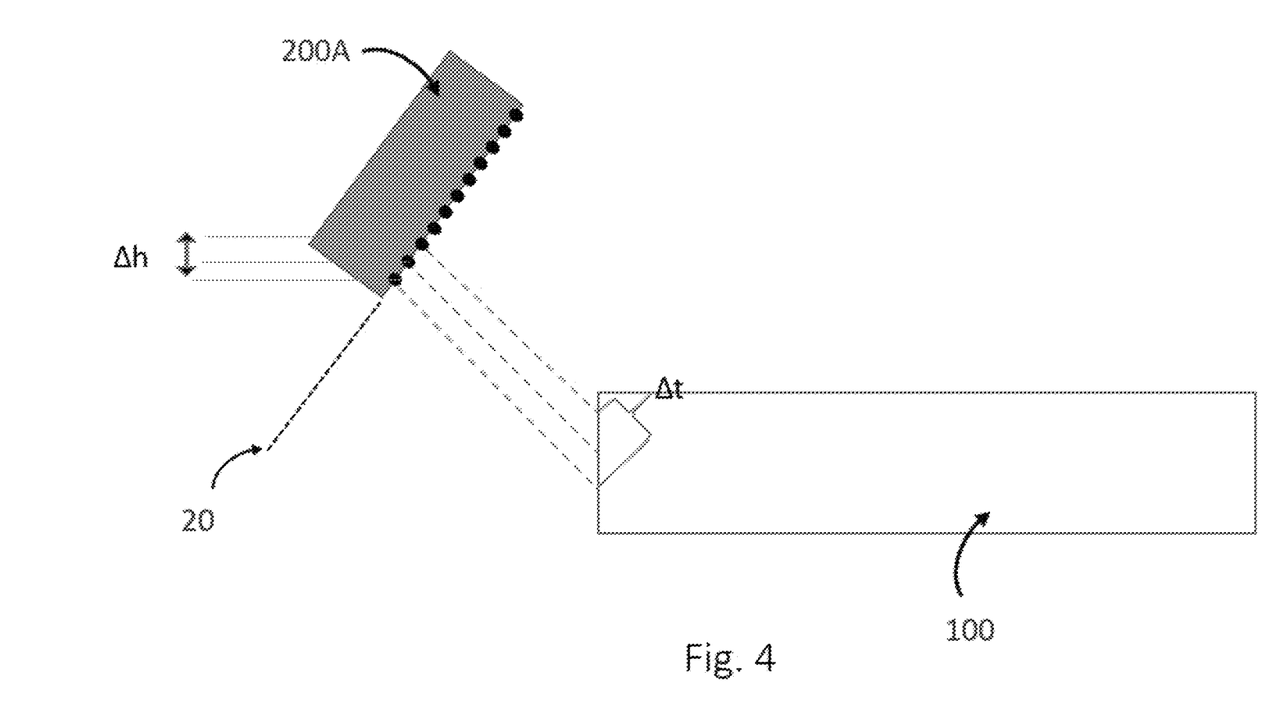
FIG. 4 shows a simplified alternative set-up of a printer suitable for carrying out a printing method according to a preferred embodiment of the invention.

FIG. 4 shows a simplified alternative set-up of a printer useful for carrying out the method of the present invention. In FIG. 4, only one print head 200A is provided. The Δt in FIG. 4 denotes a difference in impact times of the ink discharged from different print nozzles 200A1-200An on a vertical side surface of the object 100.

In the alternative set-up of FIG. 4, the print head 200A may be displaced around a horizontal axis and/or a vertical axis in order to print another print pattern on the exposed surface of the object 100 upon reversing the movement of the object.

In another alternative set-up, the print head 200A may be stationary, and instead the object 100 is displaced or rotated by preferably about 180° in order to print a print pattern on the remaining exposed surfaces of the object 100.

In order to determine the amount of ink to be discharged from each print nozzle 200A1-200An, the transfer time of the ink is taken into account. Also, any differences in transfer times Δt of the ink discharged from different print nozzles 200A1-200An need to be considered. In addition, layer thickness and possibly other user requirements are taken into consideration. Furthermore, each print nozzle 200A1-200An may be controlled individually in that the amount of ink discharged from each print nozzle 200A1-200An may vary. In addition, the discharge time of the ink may vary from one print nozzle 200A1-200An to another print nozzle 200A1-200An, and the velocity of the object 100 relative to the one or more print heads 200A, 200B needs to be considered. All of these parameters may also be included in the print file obtained in step S2.

As a simplified example of the printing method for obtaining a uniform and homogenous layer thickness on the surface of a cuboid object 100 using an inkjet printer comprising two co-linearly arranged print heads 200A, 200B, the amount of ink deposited on the top surface of the cuboid during movement of the cuboid towards print head 200A has to be half of the amount of ink deposited on the side surfaces of the cuboid. The reason for this ratio is that the top surface is printed twice, i.e., during movement of the cuboid towards the print head 200A and during movement towards the print head 200B, whereas the side surfaces are printed only once due to one pair of the side surfaces being in the printing shadow of one print head 200A or 200B.

After each or a predetermined number of printing steps, the functional print pattern may be cured. If an ink is used which requires crosslinking, the crosslinked ink may further undergo a chemical reduction step as a result of which metal in the form of nanoparticles will precipitate. Any solvent will evaporate, and the printed ink will be sintered. The curing step is understood to include all of these chemical processes which occur in particular types of ink.

Referring to FIG. 2, the data included in the print file are sent to a controller of the inkjet printer in step S3. The controller then controls the entire printing process until all printing specifications are fulfilled.

Although illustrated and described above with reference to certain specific embodiments and examples, the present disclosure is nevertheless not intended to be limited to the details shown. Rather, various modifications may be made in the details within the scope and range of equivalents of the claims and without departing from the spirit of the disclosure. It is expressly intended, for example, that all ranges broadly recited in this document include within their scope all narrower ranges which fall within the broader ranges.

What is claimed:

1. An additive printing method for printing a functional print pattern on a surface of a three-dimensional object, the method comprising the steps of:
   providing a three-dimensional object on a planar surface;
   providing a print head having a plurality of print nozzles, the plurality of print nozzles defining at least one print nozzle plane, the print nozzle plane being non-parallel to the planar surface;

generating three-dimensional geometrical surface data of an exposed surface of the three-dimensional object on the planar surface;

generating two-dimensional geometrical surface data of the exposed surface of the three-dimensional object on the planar surface on the basis of the three-dimensional geometrical surface data;

determining an amount of printing fluid to be discharged at a discharge time from each of the plurality of print nozzles;

generating a relative movement between the three-dimensional object and the print head; and printing a functional print pattern on at least one portion of the exposed surface of the three-dimensional object during the relative movement, wherein the step of generating the two-dimensional geometrical surface data includes the step of projecting the two-dimensional geometrical surface data onto the print nozzle plane to correct distortions present in the two-dimensional geometrical surface data due to the print nozzle plane being non-parallel with the planar surface, thereby obtaining two-dimensional print nozzle plane data of the three-dimensional object.

2. The method according to claim 1, wherein the three-dimensional geometrical surface data and the two-dimensional geometrical surface data are generated relative to the planar surface.

3. The method according to claim 1, further comprising the step of determining positional data of the three-dimensional object on the planar surface.

4. The method according to claim 3, wherein the step of determining positional data of the three-dimensional object on the planar surface includes using an optical imaging or optical scanning device.

5. The method according to claim 3, wherein the step of projecting the two-dimensional geometrical surface data onto the print nozzle plane takes into account the positional data of the three-dimensional object on the planar surface.

6. The method according to claim 1, wherein the three-dimensional geometrical surface data are generated using 3D-CAD data or 3D data obtained by an imaging scanning device.

7. The method according to claim 1, wherein the amount of printing fluid to be discharged from each of the plurality of print nozzles is determined based on one or more of:
(i) the two-dimensional print nozzle plane data,
(ii) a layer thickness of the functional print pattern,
(iii) a characteristic of the relative movement,
(iv) a transfer time of the printing fluid, the transfer time being defined by the time period which elapses between the discharge time of the printing fluid from the respective print nozzle and an impact time on the exposed surface of the three-dimensional object,
(v) the print pattern to be printed on the exposed surface of the three-dimensional object, and
(vi) a user requirement.

8. The method according to claim 7, wherein the characteristic of the relative movement is a relative velocity between the three-dimensional object and the print head.

9. The method according to claim 1, wherein the discharge time of the printing fluid varies among the plurality of print nozzles.

10. The method according to claim 1, wherein during relative movement between the three-dimensional object and the print head, the three-dimensional object is moved relative to the print head.

11. The method according to claim 1, wherein after the functional print pattern has been printed on the at least one portion of the exposed surface of the three-dimensional object, the print head or the three-dimensional object is displaced around a horizontal axis and/or a vertical axis in order to print another print pattern on the exposed surface of the three-dimensional object.

12. The method according to claim 1, wherein after the functional print pattern has been printed on the at least one portion of the exposed surface of the three-dimensional object, the functional print pattern is cured.

13. The method according to claim 1, wherein the print nozzle plane and the planar surface are oriented at an angle in a range between about 20° to 70°.

14. The method according to claim 13, wherein the angle is about 45°.

15. The method according to claim 1, further comprising the steps of providing a second print head having a plurality of second print nozzles, the plurality of second print nozzles defining at least one second print nozzle plane, the second print nozzle plane being non-parallel to the planar surface; arranging the second print head co-linearly with the print head; and generating a relative movement between the three-dimensional object and the second print head.

16. The method according to claim 15, wherein the relative movement between the three-dimensional object and the print head and the relative movement between the three-dimensional object and the second print head are generated along a straight printing path on which the co-linear print head and second print head are arranged.

17. The method according to claim 1, wherein the method is an inkjet printing method.

18. The method according to claim 1, wherein the functional print pattern has a layer thickness in a range of about 0.8 µm to 1.2 µm.

19. A computer program product comprising a computer-readable medium having stored thereon computer-executable instructions that, when executed, cause an inkjet printer to carry out the steps of:
generating three-dimensional geometrical surface data of an exposed surface of a three-dimensional object on a planar surface;
generating two-dimensional geometrical surface data of the exposed surface of the three-dimensional object on the planar surface on the basis of the three-dimensional geometrical surface data; and
determining an amount of printing fluid to be discharged at a discharge time from a print head having a plurality of print nozzles, the plurality of print nozzles defining at least one print nozzle plane, the print nozzle plane being non-parallel to the planar surface, wherein the step of generating the two-dimensional geometrical surface data includes the step of projecting the two-dimensional geometrical surface data onto the print nozzle plane to correct distortions present in the two-dimensional geometrical surface data due to the print nozzle plane being non-parallel with the planar surface, thereby obtaining two-dimensional print nozzle plane data of the three-dimensional object.

* * * * *